United States Patent
Dally

(10) Patent No.: US 9,106,235 B2
(45) Date of Patent: Aug. 11, 2015

(54) MESOCHRONOUS SYNCHRONIZER WITH DELAY-LINE PHASE DETECTOR

(71) Applicant: NVIDIA Corporation, Santa Clara, CA (US)

(72) Inventor: William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/942,614

(22) Filed: Jul. 15, 2013

(65) Prior Publication Data
US 2015/0015314 A1    Jan. 15, 2015

(51) Int. Cl.
*H04L 7/00* (2006.01)
*H03L 7/00* (2006.01)

(52) U.S. Cl.
CPC ............... *H03L 7/00* (2013.01); *H04L 7/0012* (2013.01)

(58) Field of Classification Search
CPC .................................................. H04L 7/0012
USPC .................................. 327/162, 163, 182, 183
See application file for complete search history.

(56) References Cited

U.S. PATENT DOCUMENTS

2012/0075000 A1* 3/2012 Cho et al. ...................... 327/288

OTHER PUBLICATIONS

Dennison, L. R. et al., "Low-Latency Plesiochronous Data Retiming," Proceedings of the 16th Conference on Advanced Research in VLSI, Computer Society Press, Mar. 27-29, 1995, pp. 304-315.
Dally, W. J. et al., "Digital Systems Engineering," Cambridge University Press, 1st edition, 1998, pp. 528-545 (Authors Version).

* cited by examiner

*Primary Examiner* — John Poos
(74) *Attorney, Agent, or Firm* — Zilka-Kotab, PC

(57) ABSTRACT

A method and a system are provided for synchronizing a signal. A keep out window is defined relative to a second clock signal and an edge detection signal is generated that indicates if an edge of a first clock signal is within the keep out window. The edge detection signal may be filtered. An input signal is received in a domain corresponding to the first clock signal and a delayed input signal is generated. Based on the edge detection signal or the filtered edge detection signal, either the input signal or the delayed input signal is selected, to produce an output signal in a domain corresponding to the second clock signal.

20 Claims, 12 Drawing Sheets

MESOCHRONOUS SYNCHRONIZER WITH DELAY-LINE PHASE DETECTOR

FIELD OF THE INVENTION

The present invention relates to circuits, and, more specifically to synchronization of a signal.

BACKGROUND

Many digital systems have multiple dock domains. Thus, when signals move from one clock domain to another, they must be synchronized to avoid metastability and synchronization failure. Typically, signals passing between clock domains are synchronized with a periodic clock using asynchronous first-in, first-outs (FIFOs). A significant area overhead is incurred for the FIFO memory. The FIFOs also add several cycles of delay as the Gray-coded input and output pointers of the FIFO must be synchronized through multiple flip-flops to reliably transmit the signals across clock domains.

There is thus a need for addressing these and/or other issues associated with the prior art.

SUMMARY

A method and a system are provided for synchronizing a signal using a mesochronous synchronizer. Mesochronous clock signals operate at the same frequency and may have an unknown or arbitrary phase relationship. A keep out window during which an input signal should not be passed from a domain corresponding to a first clock signal to a domain corresponding to a second clock signal is defined relative to the second clock signal and an edge detection signal is generated that indicates if an edge of the first clock signal is within the keep out window. The edge detection signal may be filtered. The input signal is received in the domain corresponding to the first dock signal and a delayed input signal is generated. Based on the edge detection signal or the filtered edge detection signal, either the input signal or the delayed input signal is selected, to produce an output signal in the domain corresponding to the second clock signal.

DETAILED DESCRIPTION

Figure 1:
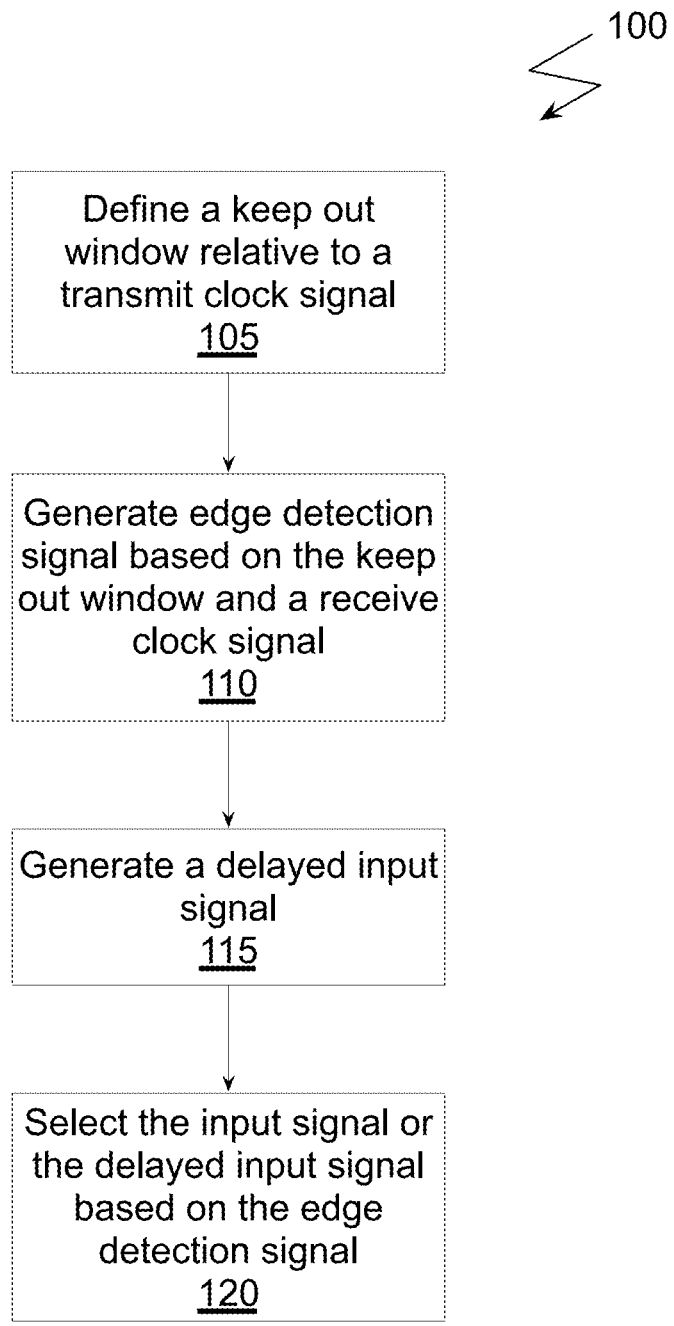
FIG. 1 illustrates a flowchart of a method for synchronizing a signal, in accordance with one embodiment.

Processors used in smartphones, tablets, laptops, and other mobile devices sometimes reduce the supply voltage provided to one or more integrated circuit devices to reduce power consumption and extend the time between battery recharging. The integrated circuit devices may also vary the power supply voltage levels to different circuits within the device based on different operating modes. Power supply voltages may also change due to transients in the supply current drawn by a component. As a power supply voltage level is reduced, any clock signals dependent on the particular power supply voltage level may operate at a lower frequency. When the power supply voltage level increases, the frequency of the clock signal also increases. Similarly, the phase relationships between the clock signals may vary. Because the clock frequencies and/or relative phases may vary as a function of power supply voltage levels, conventional synchronization techniques that rely on a fixed relationship between different clock domains cannot necessarily be relied on for transmitting signals between clock domains.

Although, the relative phases of clocks may vary in response to varying power supply voltage levels, the techniques described herein may also be applied to situations for which the relative dock phases vary for other reasons. For example, relative clock phases may vary as temperature varies or may vary as a result of programming.

With respect to the present description, a first clock domain is a clock domain of any type of system from which a signal may be transmitted. For example, the first dock domain could be a clock domain of a central processing unit (CPU), a graphics processing unit (GPU), a memory controller, and/or any other system with a clock domain. The first clock domain may include a first clock signal having a particular frequency. A second clock domain may include a second clock signal having the same frequency as the first clock signal, but with an unknown or arbitrary phase relationship. In other words, the first and the second clocks are mesochronous. The relative phase relationship between the first clock signal and the second clock signal may be any value from 0 to 360 degrees and is relatively stable. For example, the relative phase may change slowly—varying by at most a few degrees per clock cycle. Signals that are transmitted from the first domain to the second domain are synchronized to the second clock domain.

Rather than using a conventional synchronizer that passes signals between clock domains using asynchronous first-in, first-out buffers (FIFOs), a mesochronous synchronizer may be may be designed that has lower latency and a lower probability of failure. Assuming that the first clock signal is in a transmitting clock domain and the second clock signal is in a receiving clock domain, a keep out window is determined relative to the first clock signal. Signals in the transmitting clock domain should be sampled by and passed to the receiving clock domain outside of the keep out window.

FIG. 1 illustrates a flowchart of a method 100 for synchronizing a signal, in accordance with one embodiment. At step 105, a keep out window is defined relative to a first clock signal (i.e., transmit clock signal). At step 110, an edge detection signal is generated using the keep out window and a second clock signal (i.e., receive clock signal). Then, at step 115, an input signal is received in the domain corresponding to the first clock signal and a delayed input signal is generated. The edge detection signal indicates whether or not an edge of the second clock used to sample the input signal is within the keep out window. At step 120, based on the edge detection signal, either the input signal or the delayed input signal is selected, to produce an output signal in the domain corresponding to the second clock signal.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Two, three, or four samples of the TxClk may be sufficient to generate an edge detection signal that indicates whether each edge of a transmit clock signal falls within a keep out window of a receive clock signal. In one embodiment, a filter may be used to steady the edge detection signal when pulses of either the transmit clock signal or the receive clock signal may be skipped or if the relative phase between the transmit clock signal and the receive clock signal is on the edge of the keep out window.

Figure 2A:
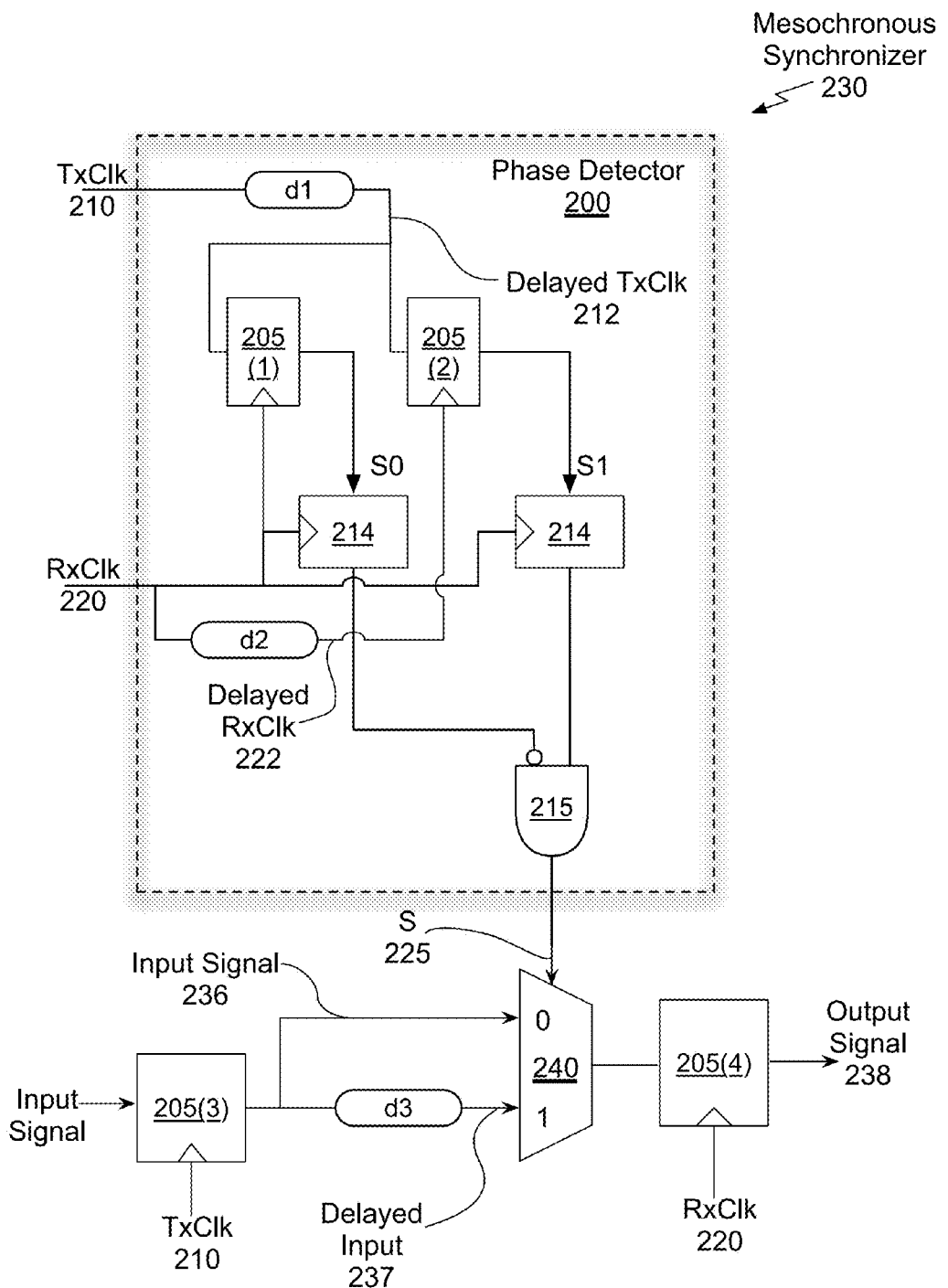
FIG. 2A illustrates a mesochronous synchronizer with a two-sample phase detector, in accordance with one embodiment.

FIG. 2A illustrates a mesochronous synchronizer 230 with a two sample phase detector 200, in accordance with one embodiment. The mesochronous synchronizer 230 receives a first clock signal, transmit clock (TxClk) 210, a second clock signal, receive clock (RxClk) 220, and an input signal 236. The mesochronous synchronizer 230 generates an output signal 238 that is synchronized to a second clock domain corresponding to the RxClk 220. The phase detector 200 receives the TxClk 210 and the RxClk 220 and generates a select signal, S 225 based on the keep out window and the RxClk 220. The phase detector 200 includes a delay element d1 that produces a delayed TrClk 212 as an input to each of two flip-flops 205. The phase detector 200 also includes a delay element d2 that produces a delayed RxClk 222. A delay element may be implemented using a chain of inverters or other circuitry that delays a signal by a known amount of time. RxClk 220 is input to a first flip-flop 205(1) to sample the delayed TxClk 212 and produce a first sample S0. Delayed RxClk 222 is input to a second flip-flop 205(2) to sample the delayed TxClk 212 and produce a second sample S1.

The phase detector 200 is designed to continuously detect when a rising edge of the TxClk 210 falls within a keep out window around the rising edge of RxClk 220. The keep out window is defined by the delay elements d1 and d2 and is relative to the RxClk 220. The keep out window has width equal to the delay element d2 and starts at a time before the rising edge of RxClk 220 that equals the delay unit d1. The delays d1 and d2 are related to the setup, hold, and clock-to-q times of the flip-flops 205 in the mesochronous synchronizer 230 and have added margin to account for timing jitter and slow changes in clock phase. When the rising edge of TxClk 210 occurs within the keep out window, the first flip-flop 205(1) will be cleared (i.e., S0=0) and the second flip-flop 205(2) will be set (i.e., S1=1), causing the signal S 225 that is generated by the logic gate 215 to go high.

Each flip-flop 205 is followed by a synchronizer 214 that is clocked by the RxClk 220 and allows any metastable states to decay. The synchronizers 214 also align the outputs of the flip-flops 205 with the RxClk 220. The synchronizers 214 typically include one or more flip-flops in series, an amount that is high enough to achieve a low probability of synchronization failure (e.g., 2 to 5 flip-flops depending on clock rate and process technology).

The signal S 225 may be used directly to select one of the two inputs of a multiplexer 240. A first input to the multiplexer 240 is an undelayed input signal 236 that is output by the flip-flop 205(3) in the transmit clock domain. The second input to the multiplexer 240 is a delayed input signal 237 generated by a delay element d3. When the edge of the RxClk 220 is in the keep out window, the delayed input signal 237 is selected as the output of the multiplexer 240 because the undelayed input signal 236 should not be sampled. Otherwise, when the edge of the RxClk 220 is not in the keep Gut window, the undelayed input signal 236 is selected as the output of the multiplexer 240. The output of the multiplexer 240 is input to the flip-flop 205(4) to be sampled by the RxClk 220 and produce the output signal 238.

If the TxClk 210 and the RxClk 220 do not skip pulses, then the signal S 225 being low indicates that the rising edge of the RxClk 220 occurred outside of the keep out window. If, however pulses of the TxClk 210 can be skipped, the signal S 225 going low could either indicate that that edge of RxClk 220 occurred outside of the keep out window or that there was no TxClk 210 edge. To distinguish between these different cases additional flip-flops 305 are added to sample the delayed TxClk 212 at different points, as described in further detail in conjunction with FIGS. 3A, 3B, and 3C. In one embodiment, a filter unit may be included between the output of the logic gate 215 to filter the signal S 225 when the relative phase between TxClk 210 and RxClk 220 is on the edge of the keep out window. Examples of a filter unit are described in conjunction with FIGS. 4A, 4B, 4C, 5A, and 5B.

Figure 2B:
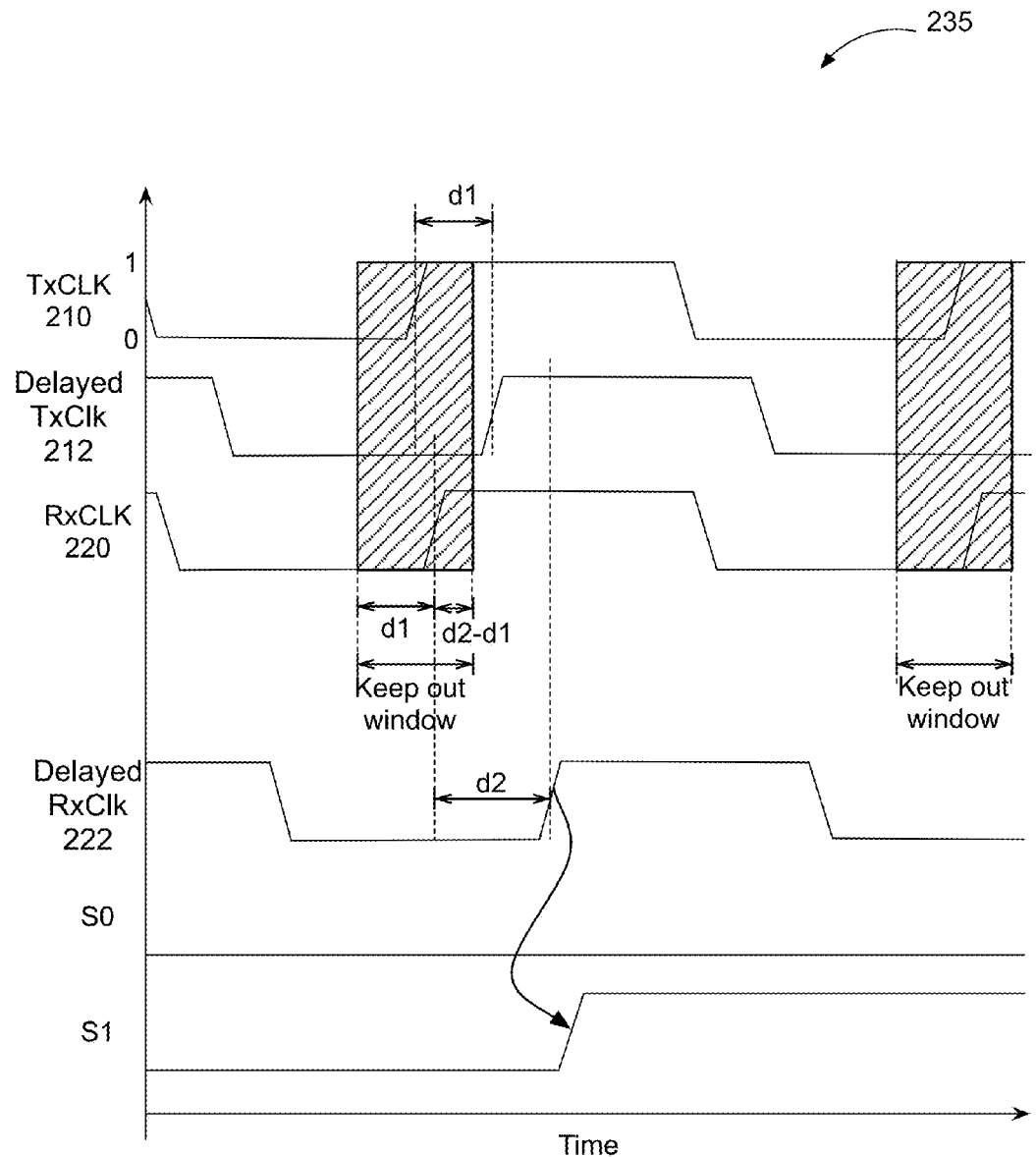
FIG. 2B illustrates a timing diagram for the mesochronous synchronizer of FIG. 2A, in accordance with one embodiment.

FIG. 2B illustrates a timing diagram 235 for the mesochronous synchronizer 230 of FIG. 2A, in accordance with one embodiment. The rising edge of delayed TxClk 212 occurs a time delay d1 after the rising edge of TxClk 210. The delay d1 corresponds to the setup time of the flip-flop 205, t_setup. In one embodiment, d1 =t_setup−t_dcq, where t_dcq is the clock-to-q delay for the flip-flop 205. The rising edge of delayed RxClk 222 occurs a time delay d2 after the rising edge of RxClk 220. The difference between delays d2 and d1 corresponds to the hold time of the flip-flop 205, t_hold. In one embodiment, d2−d1 =t_hold−t_dcq.

The keep out window starts at a time d1 before the rising edge of RxClk 220 and ends at a time d2−d1 after the rising edge of RxClk 220. Therefore, the keep out window has a width of d2. As shown in timing diagram 235, the rising edge of TxClk 210 occurs within the keep out window. The edge detection signal that is generated as !S0 && S1 is asserted (at a logical high) when delayed TxClk 212 is sampled by delayed RxClk 222 and S1 becomes a logical high.

Figure 2C:
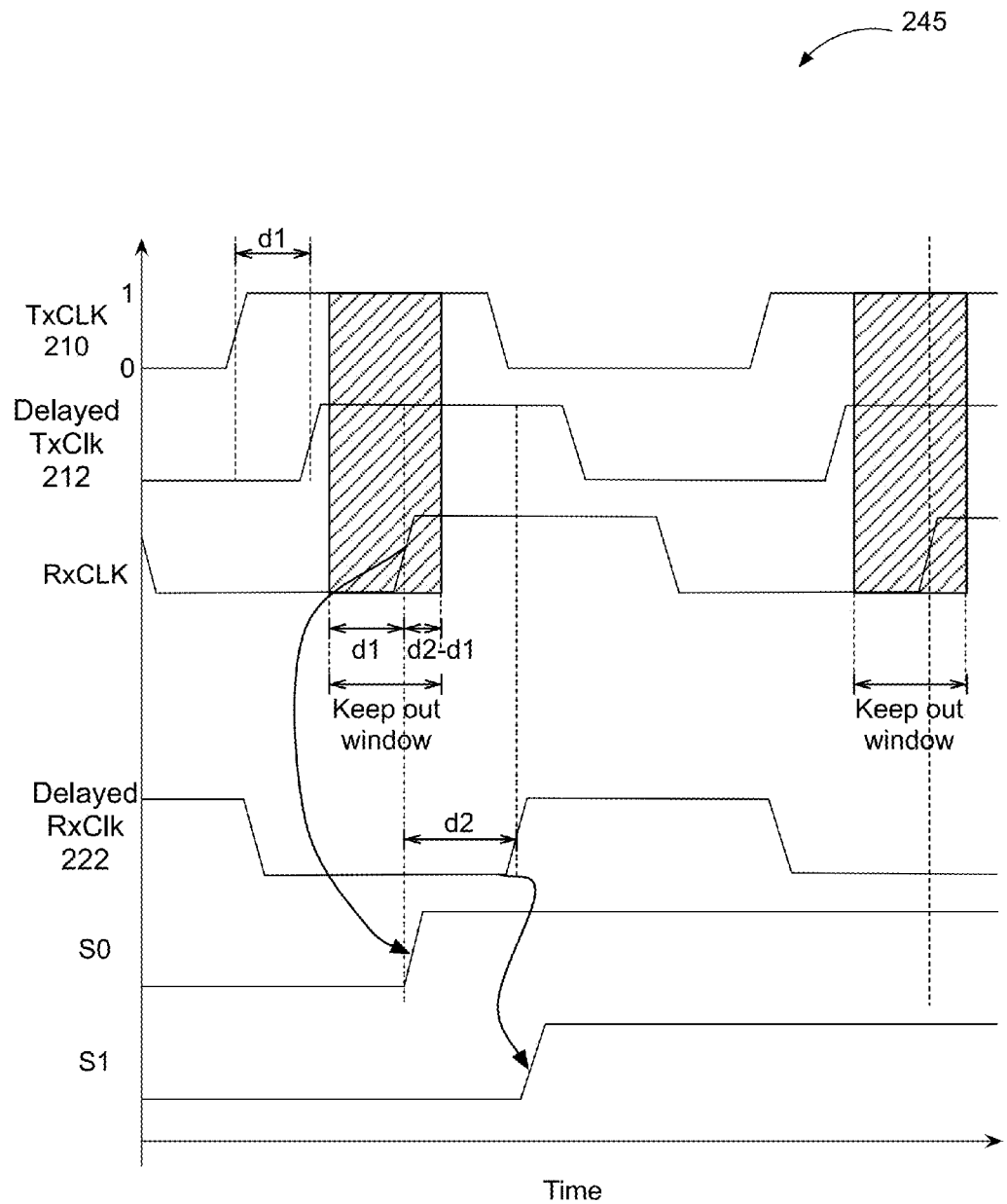
FIG. 2C illustrates another timing diagram for the mesochronous synchronizer of FIG. 2A, in accordance with one embodiment.

FIG. 2C illustrates another timing diagram 245 for the mesochronous synchronizer 230 of FIG. 2A, in accordance with one embodiment. As shown in timing diagram 245, the rising edge of TxClk 210 occurs outside of the keep out window. The edge detection signal is negated (at a logical low) when delayed TxClk 212 is sampled by RxClk 220 and S0 becomes a logical high and remains negated d2 later when delayed TxClk 212 is sampled by delayed RxClk 222 and S1 becomes a logical high.

Figure 2D:
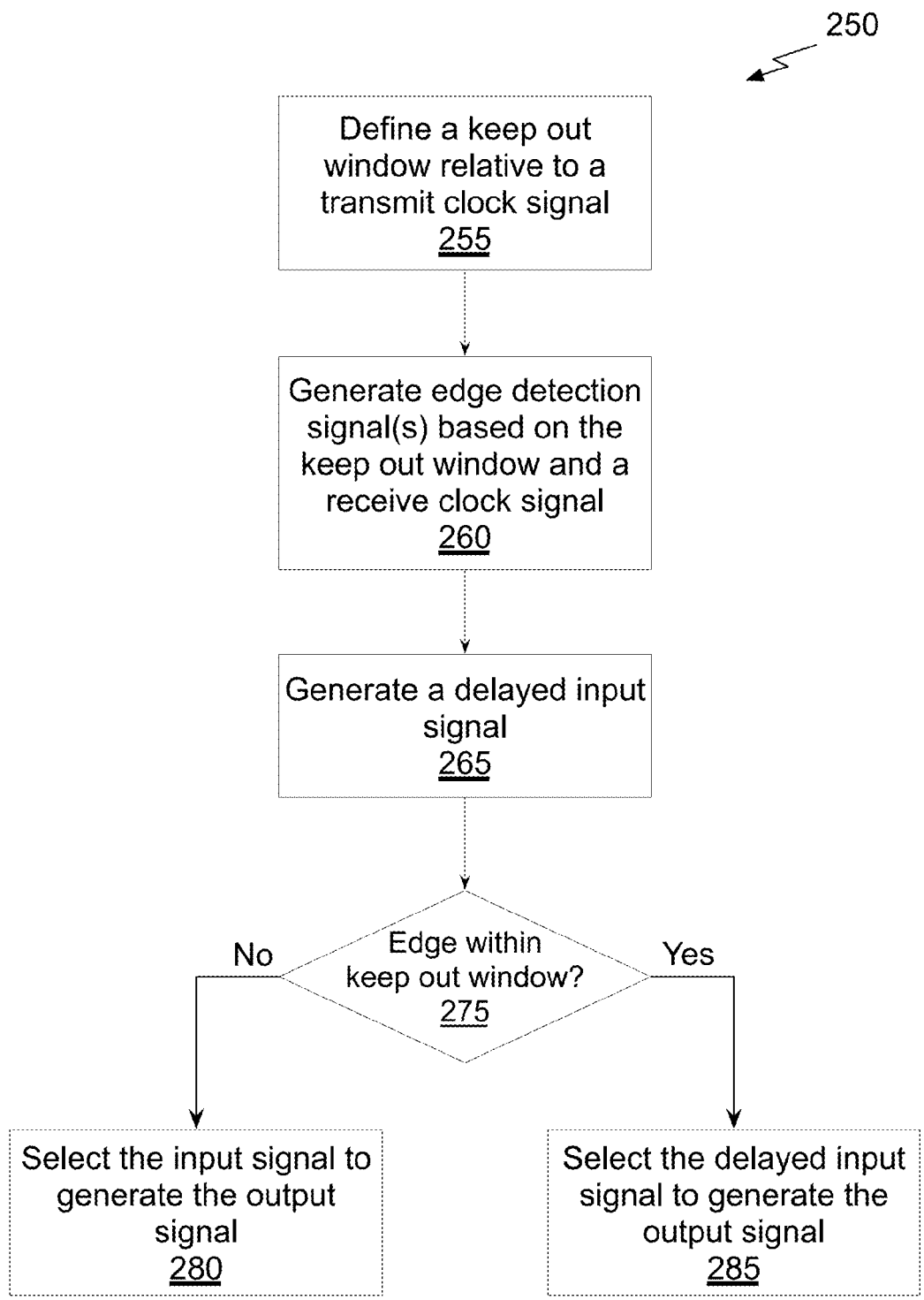
FIG. 2D illustrates a flowchart of a method for synchronizing a signal using the mesochronous synchronizer of FIG. 2A, in accordance with one embodiment.

FIG. 2D illustrates a flowchart of a method 250 for synchronizing a signal using the mesochronous synchronizer 230 of FIG. 2A, in accordance with one embodiment. At step 255, a keep out window is defined relative to the TxClk 210 and based on the delay elements d1 and d2. At step 260, an edge detection signal, S 225 is generated using the keep out window and RxClk 220. Then, at step 265, an input signal is received in the transmit clock domain corresponding to TxClk 210 and an input signal 236 and a delayed input signal 237 are generated. S 225 indicates whether or not an edge of RxClk 220 that is used to sample the input signal 236 is within the keep out window.

At step 275, the mesochronous synchronizer 230 determines whether the edge of RxClk 220 is within the keep out window. If the edge of RxClk 220 is not within the keep out window (i.e., is outside of the keep out window), then, at step 280, the input signal 236 is selected to produce the output signal in the receiving clock domain corresponding to RxClk 220. Otherwise, at step 285, the delayed input signal 237 is selected to produce the output signal in the receiving clock domain corresponding to RxClk 220.

Figure 3A:
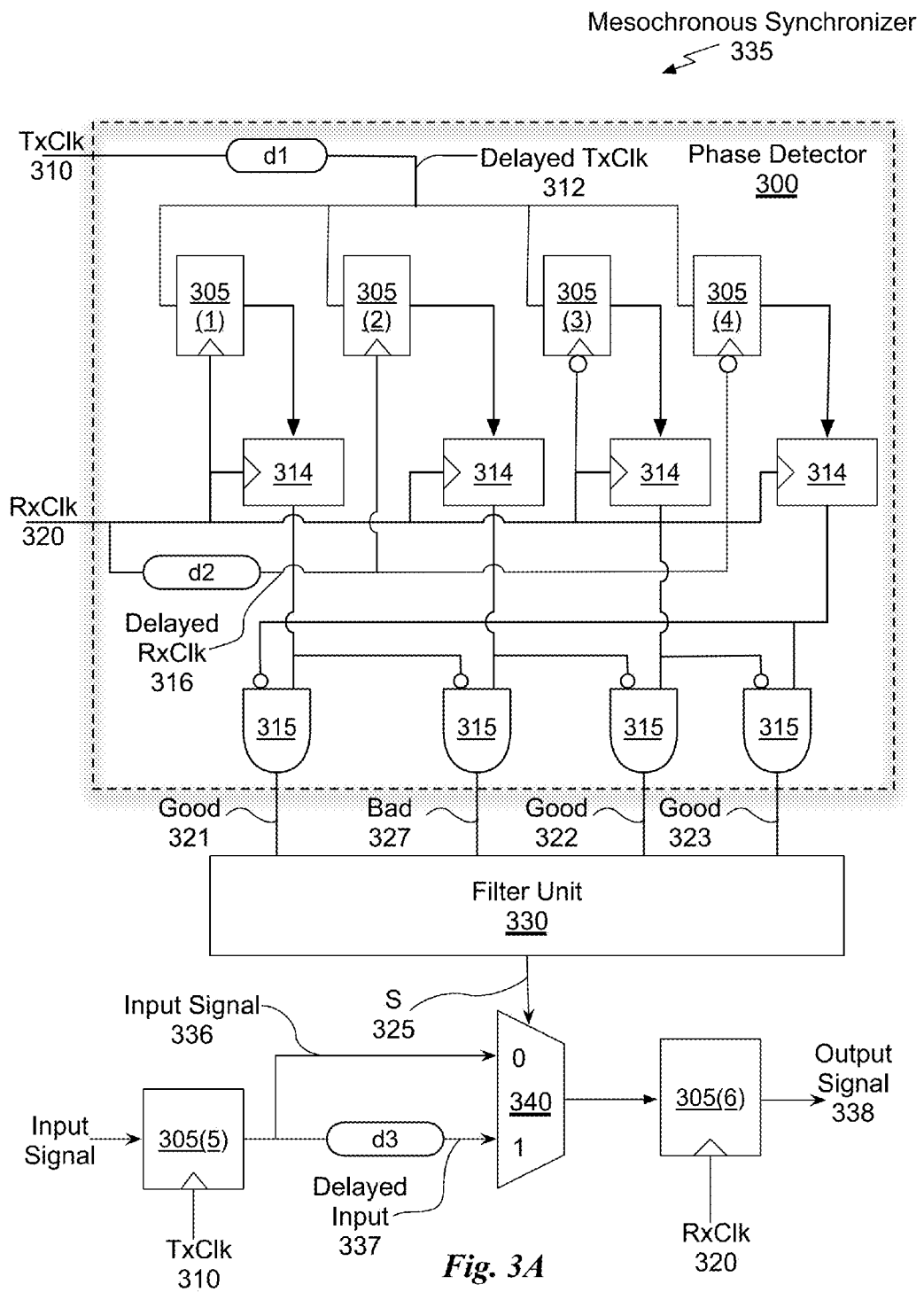
FIG. 3A illustrates another mesochronous synchronizer with a four-sample phase detector, in accordance with one embodiment.

FIG. 3A illustrates a mesochronous synchronizer 335 with a four-sample phase detector 300, in accordance with one embodiment. The mesochronous synchronizer 335 receives a first clock signal, transmit clock (TxClk) 310, a second clock signal, receive clock (RxClk) 320, and an input signal. The mesochronous synchronizer 335 generates an output signal 338 that is synchronized to a second clock domain corresponding to RxClk 320. The phase detector 300 receives the TxClk 310 and the RxClk 320 generates four edge detection signals good 321, bad 327, good 322, and good 323. The good signals 321, 322, and 323 and the had signal 327 may be filtered by a filter unit 330 to generate a select signal, S 325. In one embodiment, the three "good" signals may be logically ORed together to generate a composite good signal before being input to the filter unit 330.

The phase detector 300 includes the delay element d1 that produces a delayed TxClk 312 as an input to each of four flip-flops 205. The RxClk 320 is delayed by a delay element d2 to produce a delayed RxClk 316. RxClk 320 is input to a first flip-flop 305(1) to sample the delayed TxClk 312 and delayed RxClk 316 is input to a second flip-flop 305(2) to sample the delayed TxClk 312. To distinguish between an edge of RxClk 320 that occurs outside of the keep out window and a skipped pulse of TxClk 310, two additional flip-flops 305(3) and 305(4), two associated synchronizers 314, and three additional logic gates 315 are included in the phase detector 335.

To make sure that an edge of delayed TxClk 312 is detected by one pair of flip-flops 305, the net delay between adjacent flip-flops 305 should be less than or equal to half of the period of TxClk 310. Thus, each edge of RxClk 320 samples TxClk 310 at a time equal to d1 before and at a time (d2−d1) after that edge of RxClk 320. Each gate indicates detection of the rising edge of TxClk 310 in a particular interval of RxClk 320. The bad signal 327 indicates that a rising edge of TxClk 310 occurred between the interval—d1 and d2−d1 relative to the rising edge of RxClk 320. The good signal 322 indicates that a rising edge of RxClk 320 occurred during the interval from d2−d1 to (RxClk/2)−d1. The good signal 323 indicates that a rising edge of RxClk 320 occurred between the interval from (RxClk/2)−d1 to (RxClk/2)+d2−d1. The good signal 321 indicates that a rising edge of RxClk 320 occurred between the interval from (RxClk/2)+d2−d1 to RxClk−d1. The three "good" signals good 321, good 322, and good 323 may be logically ORed together to form a composite good signal indicating that the edge of RxClk 320 occurred in one of the three good intervals not in the "bad" keep out window). Embodiments of the filter unit 330 are described in conjunction with FIGS. 4A, 4B, 4C, 5A, and 5B.

Referring back to FIG. 2A, the signal S 225 is equivalent to the had signal 327, and, as shown in FIG. 2A, S 225 may be used directly to select one of the two inputs to the multiplexer 240. As previously explained, in one embodiment, a filter (not shown in FIG. 2A.) may be used to steady S 225.

A first input to the multiplexer 340 is an undelayed input signal 336 that is output by the flip-flop 305(5) in the transmit clock domain. The second input to the multiplexer 340 is a delayed input signal 337 generated by a delay element d3. When the edge of the RxClk 320 is in the keep out window (i.e., bad 327 is a logical high or the composite good signal is a logical low), the delayed input signal 337 is selected as the output of the multiplexer 340 because the undelayed input signal 336 should not be sampled. Otherwise, when the edge of the RxClk 320 is not in the keep out window (i.e., the composite good signal is a logical high), the undelayed input signal 336 is selected as the output of the multiplexer 340. The output of the multiplexer 340 is input to the flip-flop 305(6) to be sampled by the RxClk 320 and produce the output signal 338.

Figure 3B:
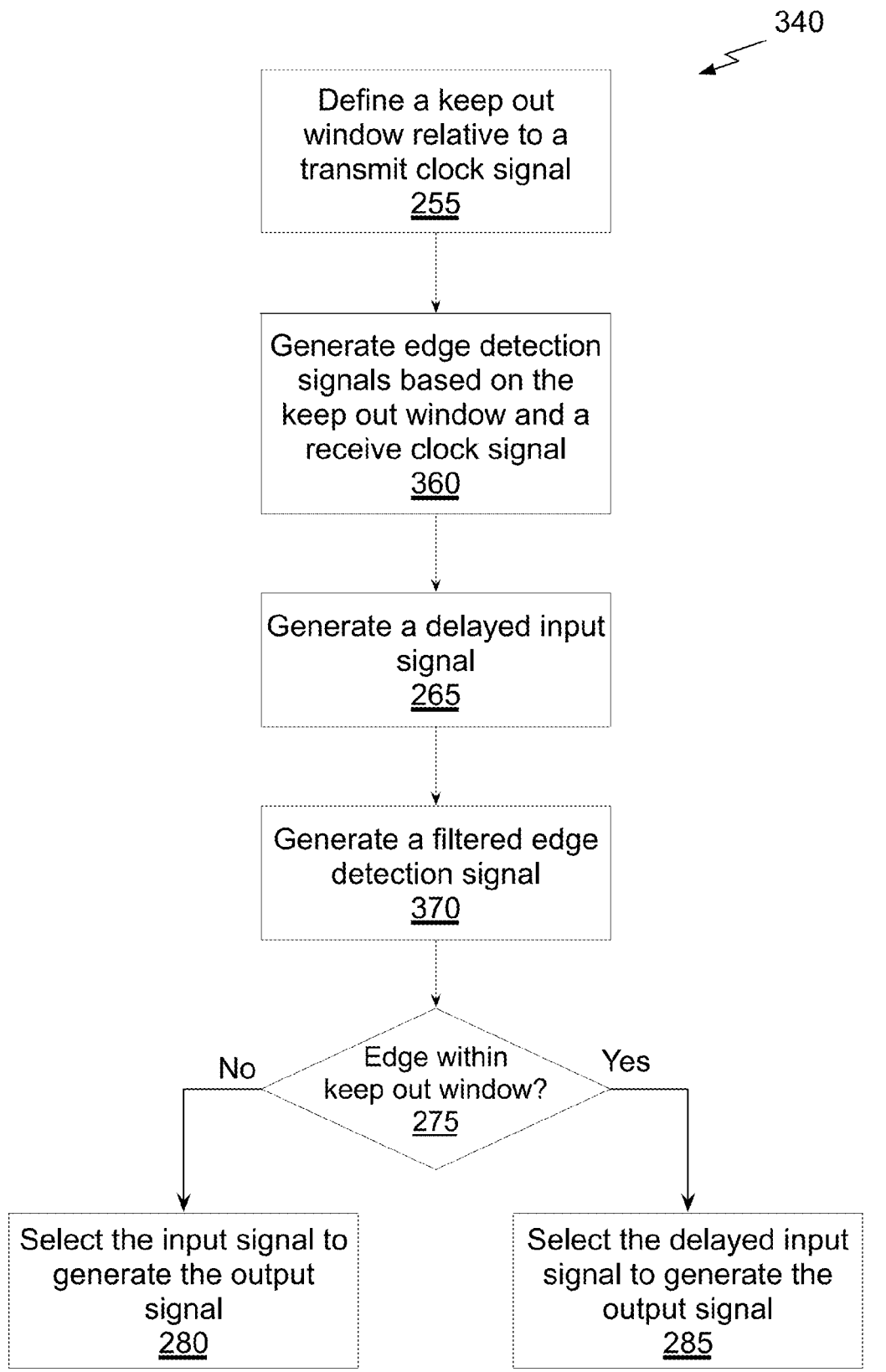
FIG. 3B illustrates a flowchart of a method for synchronizing a signal using the mesochronous synchronizer of FIG. 3A, in accordance with one embodiment.

FIG. 3B illustrates a flowchart of a method 340 for synchronizing a signal using the mesochronous synchronizer of FIG. 3A, in accordance with one embodiment. Step 255 is performed as previously described in conjunction with FIG. 2D. At step 360, edge detection signals, bad 327, good 321, good 322, and good 323 are generated using the keep out window and RxClk 320. Step 265 is performed as previously described in conjunction with FIG. 2D. At step 370, the edge detection signal S 325 that indicates whether or not an edge of RxClk 220 that is used to produce the output signal 338 is within the keep out window is generated. In one embodiment the signal S 325 is generated using a filtering technique performed by the filter unit 330. Steps 275, 280, and 285 are performed as previously described in conjunction with FIG. 2D.

Figure 3C:
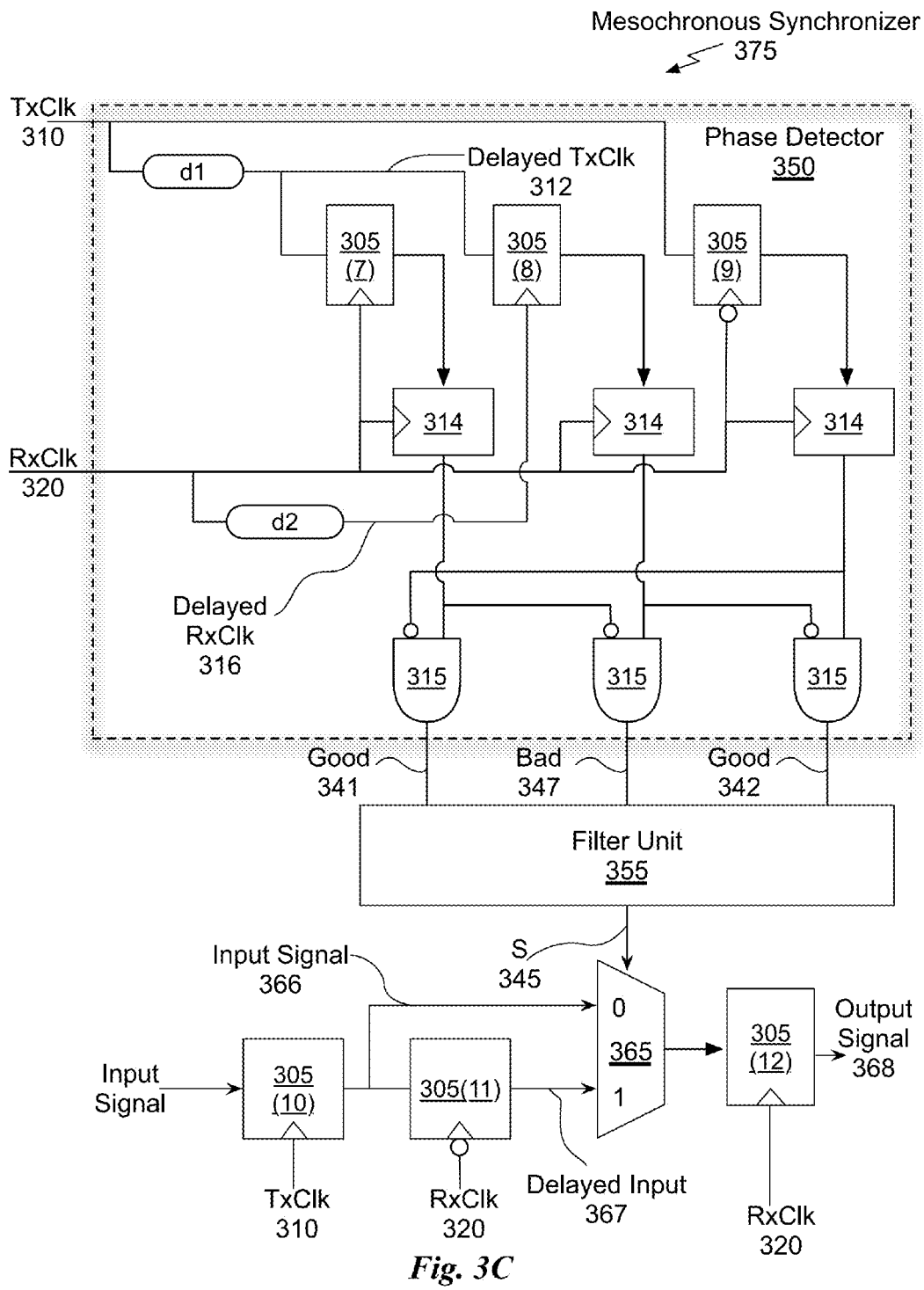
FIG. 3C illustrates another mesochronous synchronizer with a three-sample phase detector, in accordance with one embodiment.

FIG. 3C illustrates a mesochronous synchronizer 375 with a three-sample phase detector 350, in accordance with one embodiment. In contrast with the mesochronous synchronizers 230 and 335, the mesochronous synchronizer 375 uses a phase detector 350 that includes three flip-flops 305 instead of two or four flip-flops 305. The phase detector 350 includes the delay element d1 that produces a delayed TxClk 312 as an input to each of three flip-flops 305. The RxClk 320 is delayed by a delay element d2 to produce a delayed RxClk 316. RxClk 320 is input to a first flip-flop 305(7) to sample the delayed TxClk 312 and delayed RxClk 316 is input to a second flip-flop 305(8) to sample the delayed TxClk 312. A third flip-flop 305(9) samples the undelayed TxClk 310 with the undelayed falling edge of RxClk 320. The phase detector 350 also includes 3 synchronizers 314, and three logic gates 315.

When the delays d1 and (d2−d1) are sufficiently large and the clock duty factor is close enough to 50%, the three-sample phase detector 350 should be sufficient to ensure that every edge of TxClk 310 is detected by one of the three flip flops (i.e., that the entire high period of TxClk 310 does not fall between two samples). Because the phase detector 350 has 3 samples instead of 4, the amount of circuitry is reduced compared with the phase detector 300 of FIG. 3A.

The phase detector 350 generates three edge detection signals: good 341, had 347, and good 342. In one embodiment, the two "good" signals may be logically ORed together to generate a composite good signal. The composite good signal and the bad signal 347 may be filtered by a filter unit 355 to generate a select signal, S 345. Embodiments of the filter unit 355 are described in conjunction with FIGS. 4A, 4B, 4C, 5A, and 5B.

A first input to the multiplexer 365 is an undelayed input signal 366 that is output by the flip-flop 305(10) in the transmit clock domain. In FIG. 3C, the delay element d3 shown in FIGS. 2A and 3A is replaced with a flip-flop 305(11) that is clocked by the falling edge of RxClk 320 to generate a delayed input signal 367. When the undelayed input signal 366 output by the flip-flop 305(10) in the transmit clock domain is unsafe to be sampled by the rising edge of RxClk 320, then the undelayed input signal 366 should be safe to be sampled by the falling edge of RxClk 320 provided to the flip-flop 305(11). In another embodiment, the TxClk 310 may be provided to the flip-flop 305(11), so that the undelayed input signal 366 is sampled on the falling edge of TxClk 310—to delay the input signal 366 by a half of a TxClk clock period to avoid the keep out window. The output of the multiplexer 365 is input to the flip-flop 305(12) to be sampled by the RxClk 320 and produce the output signal 368.

Figure 4A:
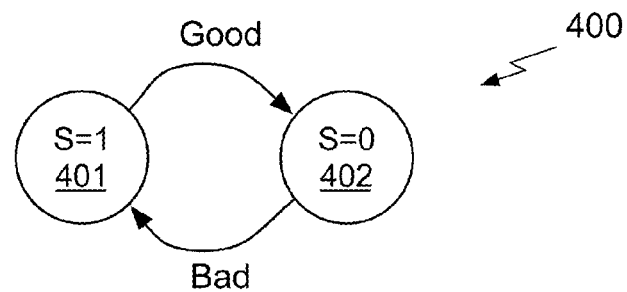
FIG. 4A illustrates a state diagram for a filter unit of FIGS. 3A and 3C, in accordance with one embodiment.

FIG. 4A illustrates a state diagram for a filter unit 400, in accordance with embodiment. The filter units 330 and 365 of FIGS. 3A and 3C, respectively, may be implemented as the filter unit 400. Additionally, in one embodiment, the mesochronous synchronizer 230 may include a filter unit 400. The filter unit 400 may be used when the transmit clock TxClk 210 or 310 may have missing pulses or when the relative phase may be "noisy" or varying. In one example, the relative phase maybe noisy when the edge of RxClk 220 or 320 is near the edge of the keep out window and there is considerable jitter in either or both of RxClk 220 or 320 or TxClk 210 or 310. The filter unit 400 is a simple finite state machine having two states, state 401 and 402. The state machine transitions to or remains in the state 401 when the bad signal (e.g., S 225, bad 327 or 347) is asserted sets the multiplexer select signal (e.g., S 225, 325, or 345) to a logical high. The state machine transitions to or remains in the state 402 when the good signal is asserted (or S 225 is negated) and sets the select signal to a logical low. In cycles where neither the bad signal nor the good signal is asserted, the state does not change and the select signal S is held at the same value.

Figure 4B:
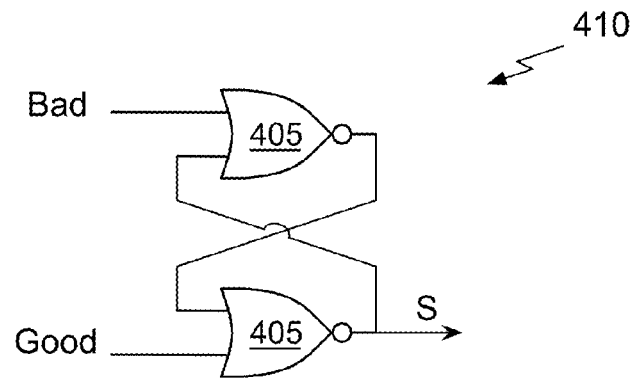
FIG. 4B illustrates another filter unit of FIGS. 3A and 3C, in accordance with one embodiment.

FIG. 4B illustrates a filter unit 410, in accordance with one embodiment. The filter units 330 and 365 of FIGS. 3A and 3C, respectively, may be implemented as the filter unit 410. Additionally, in one embodiment, the mesochronous synchronizer 230 may include a filter unit 410. The filter unit 410 is a set-reset latch including two cross-coupled NOR logic gates 405 that produce the multiplexer select signal S. A first NOR logic gate 405 receives bad (e.g., S 225, bad 327 or 347) as an input and a second NOR logic gate 405 receives good (or inverted S 225) as an input. It will be appreciated that the good signal may be the composite good signal generated by combining multiple good signals using one or more logical OR gates or additional inputs to the lower NOR gate 405.

Figure 4C:
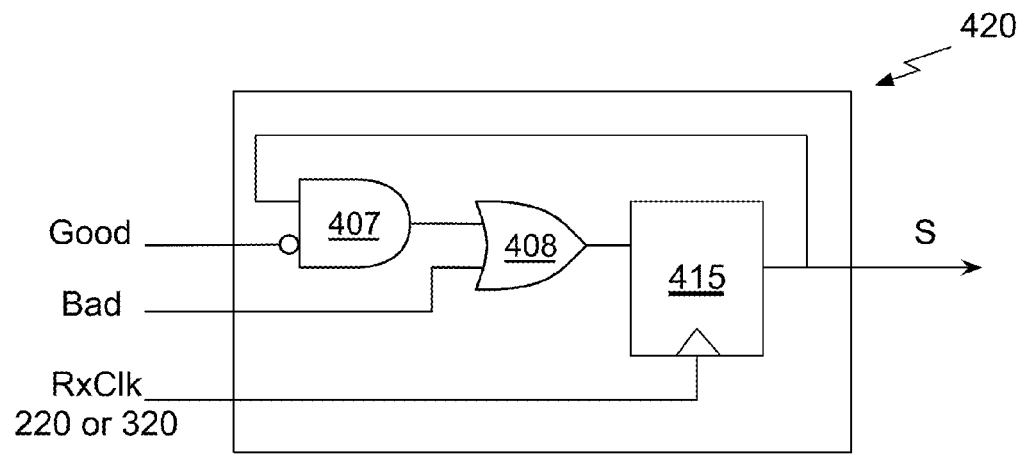
FIG. 4C illustrates another filter unit of FIGS. 3A and 3C, in accordance with one embodiment.

FIG. 4C illustrates a filter unit 420, in accordance with one embodiment. The filter units 330 and 365 of FIGS. 3A and 3C, respectively, may be implemented as the filter unit 420. Additionally, in one embodiment, the mesochronous synchronizer 230 may include a filter unit 420. The filter unit 420 is a single flip-flop 415 that is clocked with the RxClk 220 or 320 and produces the multiplexer select signal S with an AND-OR logic gate providing an input to the flip-flop 415. An AND logic gate 407 receives an inverted good signal and the multiplexer signal S to produce an input to the OR logic gate 408 that also receives the bad signal.

Figure 5A:
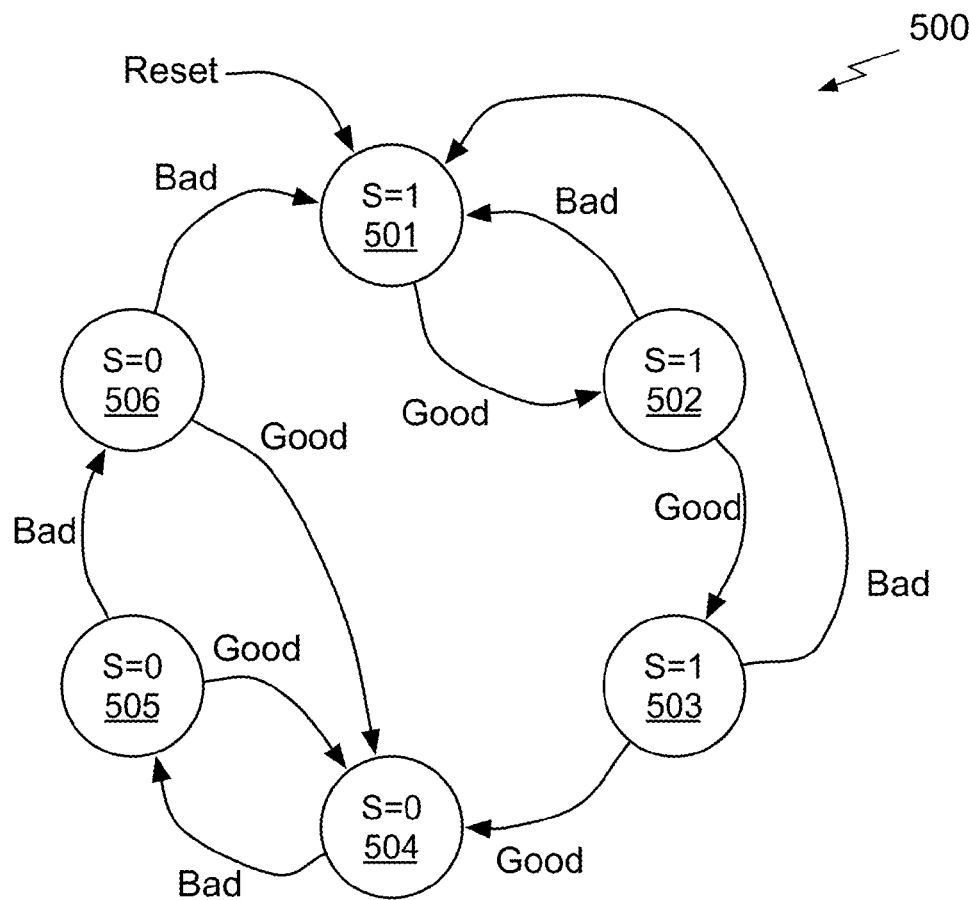
FIG. 5A illustrates a state diagram for another filter unit of FIGS. 3A and 3C, in accordance with one embodiment.

FIG. 5A illustrates a state machine for a filter unit 500, in accordance with one embodiment. The filter units 330 and 365 of FIGS. 3A and 3C, respectively, may be implemented as the filter unit 500. Additionally, in one embodiment, the mesochronous synchronizer 230 may include a filter unit 500. The filter unit 500 is a finite state machine with hysteresis that is useful when the output of the phase detector 200, 300, or 350 is noisy. For example, when the phase detector 200, 300, or 350 is noisy a sequence of bad assertions may include one or more good assertions and vice-versa. The filter unit 500 avoids toggling the multiplexer select signal S back and forth by requiring three repeated detections that are the same (e.g., three bads or three goods) before the multiplexer select signal S is toggled. In other embodiments, a finite state machine can be constructed to require N repeated detects for any integer N—to switch states.

As shown in FIG. 5A, the hysteretic filter unit 500 is reset into the state 501 and S is set to a logical high. In another embodiment, the hysteretic filter unit 500 is reset into the state 504 and S is set to a logical low. In yet another embodiment, the hysteretic filter unit 500 has a dedicated reset state and, at the next clock, transitions to either state 502 if good is asserted or state 505 if bad is asserted. The next detection after the hysteretic filter unit 500 is reset transitions from state 501 to state 502 if the good signal is asserted. When the good signal is asserted for two cycles, the hysteretic filter unit 500 transitions to state 503 and then to state 504 where S is set to a logical low if the good signal is asserted for a third cycle. If, while in state 502 or 503 the bad signal is asserted, the hysteretic filter unit 500 transitions back to state 501. Once state 504 is reached S is set to a logical low and when the bad signal is asserted for two cycles, the hysteretic filter unit 500 transitions to state 505 and then to state 506. If the bad signal is asserted for a third cycle, the hysteretic filter unit 500 transitions from state 506 to state 501 where S is set to a logical high, If, while in state 505 or 506 the good signal is asserted, the hysteretic filter unit 500 transitions back to state 504.

The hysteretic filter unit 500 may also be used in the mesochronous synchronizer 230 to handle skipped pulses of TxClk 210. A logical low of S225 is considered to be a good detect and when three consecutive (or N consecutive) pulses are either good or bad, a select input to the multiplexer 240 is toggled. When three consecutive detections are not either good or bad, the select input to the multiplexer 240 is not toggled.

Figure 5B:
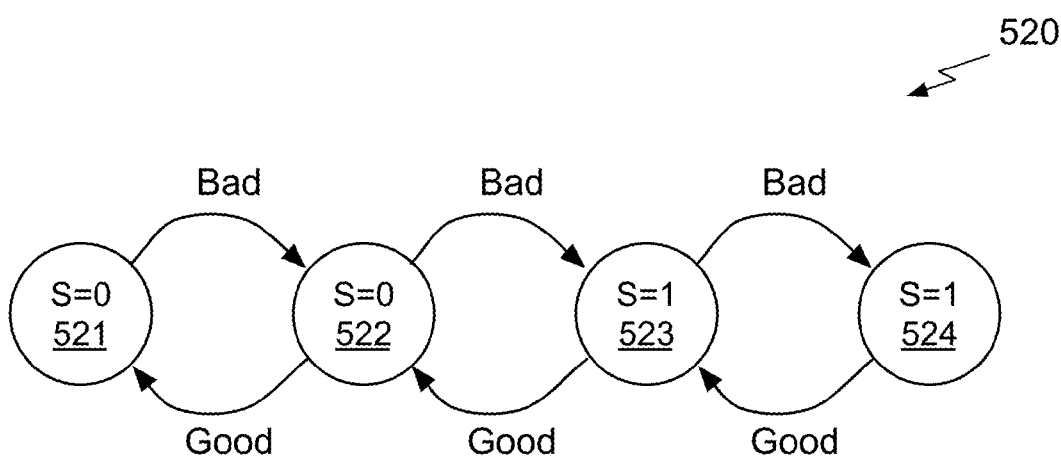
FIG. 5B illustrates a state diagram for another filter unit of FIGS. 3A and 3C, in accordance with one embodiment.

FIG. 5B illustrates a state machine for a filter unit 520, in accordance with one embodiment. The filter units 330 and 365 of FIGS. 3A and 3C, respectively, may be implemented as the filter unit 520. Additionally, in one embodiment, the mesochronous synchronizer 230 may include a filter unit 520. The filter unit 520 is a finite state machine that implements a saturating counter filter that is useful when the output of the phase detector 200, 300, or 350 is very noisy.

As shown in FIG. 5B, each bad detect transitions the counter one state to the right (i.e., from state 521 to state 522, from state 522 to state 523, and from state 523 to state 524). Conversely, each good detect transitions the counter one state to the left (i.e. from state 524 to state 523, from state 523 to state 522, and from state 522 to state 521). The multiplexer select signal S is set to a logical low in states 521 and 522 and is set to a logical high in states 523 and 524.

In situations when the hysteretic filter unit 500 may not change states because N consecutive detections of either good or bad do not occur, the saturating counter filter unit 520 will toggle the multiplexer select signal S. When the bad detections outnumber the good detections for a sequence of consecutive cycles, the saturating counter filter unit 520 will set the multiplexer select signal S to a logical high. When the good detections outnumber the bad detections for a sequence of consecutive cycles, the saturating counter filter unit 520 will set the multiplexer select signal S to a logical low. Although four states are shown in FIG. 5B, the saturating counter filter unit 520 may be implemented with a different number of states.

Figure 6A:
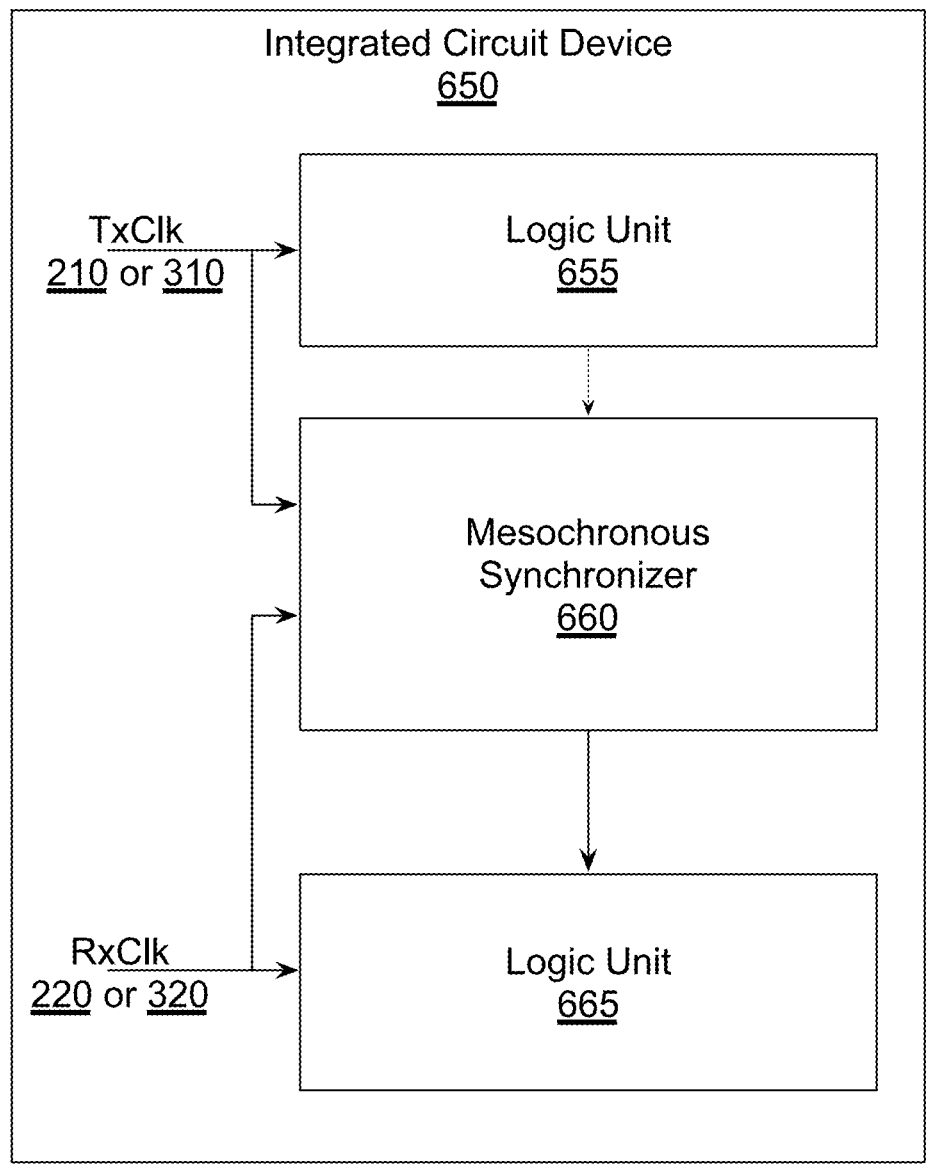
FIG. 6A illustrates an exemplary integrated circuit in which the various architecture and/or functionality of the various previous embodiments may be implemented.

FIG. 6A illustrates an exemplary integrated circuit device 650 in which the various architecture and/or functionality of the various previous embodiments may be implemented. The integrated circuit device 650 includes a logic unit 655, a mesochronous synchronizer 660, and a logic unit 665. The logic unit 655 receives TxClk 210 or 310 and generates outputs that are synchronous with TxClk 210 or 310. The outputs are received by the mesochronous synchronizer 660 and are transmitted from the clock domain of TxClk 210 or 310 to the clock domain of RxClk 220 or 320 based on the defined keep out window. The transmitted outputs that are synchronized to the clock domain of RxClk 220 or 320 are received by the logic unit 665. The mesochronous synchronizer 660 may be implemented as the mesochronous synchronizer 230, 335, or 375.

Figure 6B:
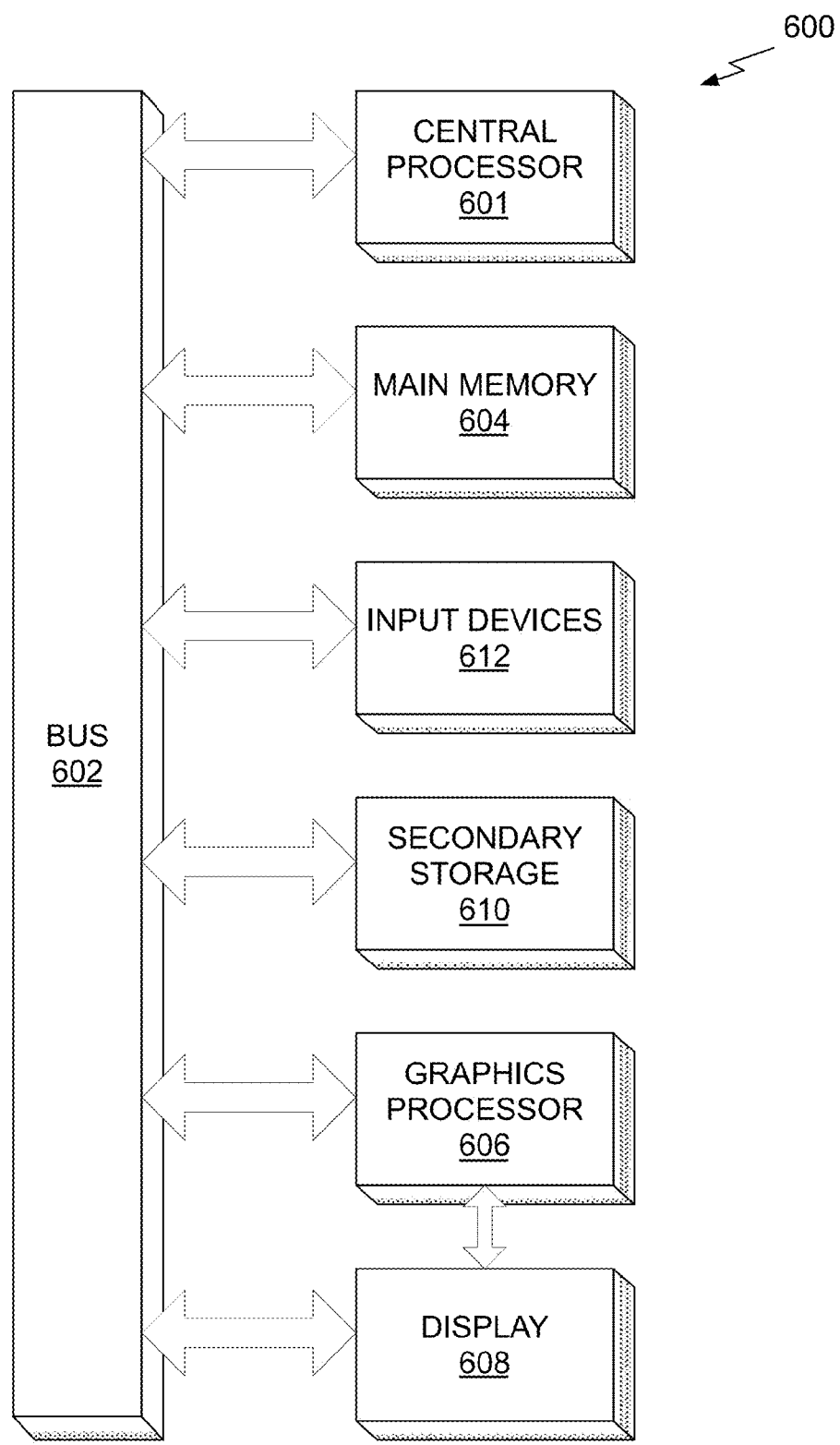
FIG. 6B illustrates an exemplary system in which the various architecture and/or functionality of the various previous embodiments may be implemented.

FIG. 6B illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. One or more of the integrated circuits shown in FIG. 6B may include the high-resolution phase detector 200 and/or 500 for transmitting signals between different clock domains.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
defining a keep out window relative to a second clock signal;
generating an edge detection signal that indicates if an edge of a first clock signal is within the keep out window;
filtering the edge detection signal;
receiving an input signal in a domain corresponding to the first clock signal;
generating a delayed input signal; and
selecting either the input signal or the delayed input signal based on the filtered edge detection signal to produce an output signal in a domain corresponding to the second clock signal, wherein the delayed input signal is selected to produce the output signal when the filtered edge detection signal indicates that an edge of the second clock signal is within the keep out window.

2. The method of claim 1, wherein the edge detection signal is generated using a two-sample phase detector circuit.

3. The method of claim 1, wherein the edge detection signal is generated using a three-sample phase detector circuit.

4. The method of claim 1, wherein the edge detection signal is generated using a four-sample phase-detector circuit.

5. The method of claim 1, wherein the filtering is performed using a reset-set flip-flop circuit.

6. The method of claim 1, wherein the filtering is performed using a synchronous finite-state machine.

7. The method of claim 6, wherein the filtering is performed using a saturating counter circuit.

8. The method of claim 6, wherein the filtering is performed using a hysteretic finite state machine circuit.

9. The method of claim 1, wherein a frequency of the first clock signal substantially equals a frequency of the second clock signal and the first clock signal and the second clock signal have an arbitrary phase relationship.

10. The method of claim 1, wherein the keep out window starts at a time d1 before a rising edge of the second clock signal and has a width equal to a time d2.

11. The method of claim 10, further comprising:
delaying the first clock signal by the time d1 to generate a delayed first clock signal; and
delaying the second clock signal by the time d2 to generate a delayed second clock signal.

12. The method of claim 11, wherein generating the edge detection signal comprises:
sampling the delayed first clock signal at an edge of the second clock signal to generate a first sample; and
sampling the delayed first clock signal at an edge of the delayed second clock signal to generate a second sample.

13. The method of claim 12, wherein the edge detection signal indicates that an edge of the second clock occurs within the keep out window when the first sample is a logical low and the second sample is a logical high.

14. A method comprising:
defining a keep out window relative to a second clock signal;
generating an edge detection signal that indicates if an edge of a first clock signal is within the keep out window;
filtering the edge detection signal;
receiving an input signal in a domain corresponding to the first clock signal;
generating a delayed input signal; and
selecting either the input signal or the delayed input signal based on the filtered edge detection signal to produce an output signal in a domain corresponding to the second clock signal, wherein the input signal is selected to produce the output signal when the filtered edge detection signal indicates that an edge of the second clock signal is not within the keep out window.

15. An integrated circuit comprising:
a phase detector circuit configured to:
define a keep out window relative to a second clock signal; and
generate an edge detection signal that indicates if an edge of a first clock signal is within the keep out window; and
synchronization circuitry coupled to the phase detector circuit and configured to:
receive an input signal in a domain corresponding to the first clock signal;
generate a delayed input signal; and
select either the input signal or the delayed input signal based on the edge detection signal to produce an output signal in a domain corresponding to the second clock signal, wherein the delayed input signal is selected to produce the output signal when the edge detection signal indicates that an edge of the second clock signal is within the keep out window.

16. The integrated circuit of claim 15, wherein a frequency of the first clock signal substantially equals a frequency of the second clock signal and the first clock signal and the second clock signal have an arbitrary phase relationship.

17. The integrated circuit of claim 15, wherein the keep out window starts at the time d1 before a rising edge of the second clock signal and has a width equal to the time d2.

18. The integrated circuit of claim 15, further comprising a filter unit coupled between the phase detector and the synchronization circuitry that is configured to filter the edge detection signal.

19. The integrated circuit of claim 17, wherein the phase detector circuit is further configured to:
delay the first clock signal by the time d1 to generate a delayed first clock signal; and
delay the second clock signal by the time d2 to generate a delayed second clock signal.

20. The integrated circuit of claim 15, wherein the input signal is selected to produce the output signal when the edge detection signal indicates that an edge of the second clock signal is not within the keep out window.

* * * * *